United States Patent
Terashima

(10) Patent No.: US 7,027,131 B2
(45) Date of Patent: Apr. 11, 2006

(54) EXPOSURE APPARATUS

(75) Inventor: Shigeru Terashima, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 156 days.

(21) Appl. No.: 10/798,800

(22) Filed: Mar. 10, 2004

(65) Prior Publication Data

US 2004/0179179 A1   Sep. 16, 2004

(30) Foreign Application Priority Data

Mar. 11, 2003 (JP) .............................. 2003-065144

(51) Int. Cl.
   *G03B 27/58*   (2006.01)
   *G03B 27/62*   (2006.01)

(52) U.S. Cl. .......................................... 355/75; 355/72

(58) Field of Classification Search ................. 355/72, 355/75; 356/399–401
   See application file for complete search history.

(56) References Cited

U.S. PATENT DOCUMENTS

| | | | |
|---|---|---|---|
| 4,798,470 A * | 1/1989 | Moriyama et al. ........... | 356/401 |
| 6,040,096 A * | 3/2000 | Kakizaki et al. ................ | 430/5 |
| 6,285,444 B1 | 9/2001 | Osanai et al. | |
| 6,359,677 B1 | 3/2002 | Itoh et al. | |
| 6,359,679 B1 | 3/2002 | Ito et al. | |
| 2001/0015799 A1 | 8/2001 | Asano et al. | |
| 2002/0008877 A1 * | 1/2002 | Iwamoto et al. ............ | 356/509 |
| 2002/0145714 A1 * | 10/2002 | Hirayanagi ................... | 355/53 |

FOREIGN PATENT DOCUMENTS

| | | |
|---|---|---|
| JP | 11-191585 | 7/1999 |
| JP | 2000-39305 | 2/2000 |
| JP | 2000-206279 | 7/2000 |
| JP | 2001-195130 | 7/2001 |

* cited by examiner

*Primary Examiner*—Rodney Fuller
(74) *Attorney, Agent, or Firm*—Morgan & Finnegan, LLP

(57) ABSTRACT

An exposure apparatus includes an optical system for guiding light from a light source to an object, a holding member for holding the object, and a measuring device for measuring position of the holding member by using a reference surface provided in the holding member, wherein the reference surface is located in an area corresponding to the object which is held by the holding member.

6 Claims, 7 Drawing Sheets

EXPOSURE APPARATUS

This application claims the right of priority under 35 U.S.C. § 119 based on Japanese Patent Application No. 2003-065144 filed on Mar. 11, 2003, which is hereby incorporated by reference herein in its entirety as if fully set forth herein.

BACKGROUND OF THE INVENTION

The present invention relates generally to exposure apparatuses for fabricating, for example, semiconductor devices, imaging devices, liquid crystal display devices, and more particularly to an exposure apparatus that exposes by using vacuum ultraviolet light like extreme ultraviolet ("EUV") light and the like.

The reduction projection exposure with UV light has been conventionally used for lithography in manufacturing fine semiconductor devices like semiconductor memories or logic circuits. The transferable minimum critical dimension in the reduction projection exposure is proportionate to a wavelength of light used for exposure, and inversely proportionate to the numerical aperture of the projection optical system. Along with recent demands for finer semiconductor devices, a shorter wavelength of ultraviolet light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet light has the limit to satisfy the rapidly promoting fine processing of a semiconductor device, and a reduction projection optical system using EUV light with a wavelength of 10 to 20 nm shorter than that of the ultraviolet has been developed to efficiently transfer a very fine circuit pattern of 0.1 μm or less.

The light absorption in a material remarkably increases in a wave range of the EUV light. Therefore, use of a refractive optical system that is generally used for visible light and UV light is not viable because of its absorption of the EUV light in the optical system. A reflection-type or catoptric optical system is used for an exposure apparatus that uses the EUV light ("EUV exposure apparatus"). A reflection reticle is used instead of a transmission reticle, which forms a pattern to be transferred. The pattern is formed on a mirror by use of an absorber.

The EUV exposure apparatus uses a multilayer mirror or an oblique incidence total reflection mirror as a reflective element. A real part of the refractive index is slightly smaller than 1 in the EUV wave range, and generates total reflection for EUV light incident upon a surface at a large incident angle or an angle close to the reflective surface. An oblique incidence total reflection mirror usually maintains a higher reflectance by several percentages for obliquely incident light within several degrees from the surface, but its degree of freedom in design is small. It is difficult to apply the oblique incidence total reflection mirror to the projection optical system.

A multilayer mirror that alternately forms or layers two kinds of materials having different optical constants is used for a mirror for EUV light with an incident angle close to normal (relatively small) incidence. The multilayer mirror includes, for example, alternately layered molybdenum (Mo) and silicon (Si) on a precisely polished glass plate. For example, a molybdenum layer is about 2 nm thick, and a silicon layer is about 5 nm thick, and about 20 pairs of layers are formed on the glass plate. A sum of thickness of two kinds of materials is generally called a coating cycle. In the above example, the total is 2 nm+5 nm=7 nm.

The multilayer mirror reflects EUV light with a specific wavelength when receiving EUV light. Efficiently reflected EUV light is one within a narrow bandwidth around λ that approximately satisfies Bragg's Equation "$2 \cdot d \cdot \cos\theta = \lambda$", where λ is a wavelength of the reflected EUV light, θ is an incident angle and d is a coating cycle and the bandwidth is about 0.6 to 1 nm. The reflectance of the EUV light would be about 0.7 at most. Non-reflected EUV light is absorbed in the multilayer film or plate, and most of the energy is consumed as heat.

The multilayer mirror has a light loss larger than a mirror for visible light. The number of multilayer mirrors should be maintained minimum when the exposure apparatus uses the multilayer mirrors as the optical system for lithography. In order to realize a large exposure area in the use of minimum number of the mirrors, a scanning exposure method which transfers a large size of area by using a light of arc shaped area ("ring field") being spaced from an optical axis and scanning the reticle and the wafer simultaneously, is preferable. Therefore, the EUV exposure apparatus generally uses the scanning exposure method.

Here is an explanation about the problem in using conventional exposure apparatus.

EUV light has a property of being absorbed by gas. For example, approximately 50% of the EUV light with the wavelength of 13 nm will be absorbed by air in 1 m distance transmission in air filled space of 10 Pa air pressure. Therefore, the air pressure of the space where the EUV light will be transmitted should be less than $10^{-1}$ Pa or preferably be less than $10^{-3}$ Pa for preventing the absorption by gas.

Moreover, in case of carbon-containing molecule such as a hydrocarbon remaining in the space where the optical element has been arranged, carbon gradually adheres on the surface of the optical element by exposure of EUV light. And it has been a problem of the reflectance decrease on EUV light absorption caused by adhered carbon. The air pressure of the space arranging the optical element to be exposed by EUV light should be less than $10^{-4}$ Pa or preferably be less than $10^{-6}$ Pa to prevent carbon adhering.

Since EUV light with the wavelength of 13–14 nm has a property of being absorbed largely by transmitting the lens or in the air, the EUV exposure apparatus does not use a conventional transmission reticle but reflection reticle, and should arrange all optical elements used in an illumination optical system or the projection optical system in vacuum state.

The reflection reticle forms information of a circuit pattern according to the difference of the reflected EUV light intensity between on a light-reflecting portion and on a light-absorbing portion. Heat generation of the reflection reticle for EUV light becomes large in comparison with the conventional transmission reticle in receiving the illumination light because of partial absorption of the reflecting-type reticle. Moreover, the reflecting-type reticle is located in vacuum state, and the heat radiation to atmosphere is little. The efficiency of the heat radiation is low because the reticle only radiates the heat by conduction to a reticle chuck which holds the reticle.

A method for holding the reticle by the reticle chuck uses an electrostatic suction instead of a conventional vacuum suction for the vacuum state of the atmosphere. The following problem has been caused by this electrostatic suction in comparison with the conventional suction. Materials of the reticle chuck are limited to acquire enough force of electrostatic suction. It does not result that the reticle can always use material having ideal low coefficient of thermal expansion.

A leakage current as a heat source generated at an electrostatic suction portion slightly happens to heat the electrostatic portion. This causes a slight heat expansion of the reticle chuck in the EUV exposure apparatus. A holding surface of the reticle chuck has an area same as or larger than the reticle for holding the reticle in its whole surface. The reticle has a space for information for positioning and for gripping by the conveying apparatus, peripheral of the circuit pattern portion. So, the whole area of the reticle is larger than the area actually used for exposure.

The EUV exposure apparatus generally uses scanning exposure method as explained before. The laser interferometer measures the position of the reticle and the wafer. FIGS. 7A and 7B show an example of the position measurement of the reticle in the conventional exposure apparatus which is for non-EUV light. The position of the reticle 101 is acquired by measuring the position of a reference surface 103 as a measuring point (measuring surface) which is provided in the reticle chuck 102 for holding the reticle 101, as shown in FIGS. 7A and 7B.

This reference surface 103 is provided on a shorter side 102a of the reticle chuck 102 to measure the position in sub-scanning direction of the reticle chuck 102. Another reference surface (not shown) is also provided on a longer side 102b of the reticle chuck 102 to measure the position in main-scanning direction of the reticle chuck 102. The sub-scanning direction in the reticle surface or the wafer surface defines X-direction. The main-scanning direction that is perpendicular to X-direction in the reticle surface or the wafer surface defines Y-direction. Direction perpendicular to the reticle surface or the wafer surface defines Z-direction.

The reticle hardly absorbs the light and hardly generates heat in the conventional exposure apparatus. Even in the case of a little heat generation, it has not been a big problem because the heat has been radiated and diffused into circumferential air. And more, the reticle chuck 101 has not generated heat by its leakage current for being vacuum suction type However, the reflection reticle absorbs the light and generates heat in the EUV exposure apparatus. And the reticle chuck of electrostatic suction type also generates heat by its leakage current. Moreover, being arranged in vacuum state, the reticle and the reticle chuck hardly diffuses heat, lack of cooling effect and become high temperature.

In this case, the reticle 101 and the reticle chuck 102 expand by thermal expansion in the conventional structure shown in FIGS. 7A and 7B, and the reticle 101 and the reference surface 103 shift their positions. For example, if the reticle 101 and the reference surface 103 are spaced as shown in FIGS. 7A and 7B, the position of the reticle 101 is measured with error, because position shift of the reticle 101 and the reference surface 103 by the thermal expansion are different from each other and the position of the reticle 101 does not correspond to that of the reference surface 103 by temperature change. This measurement error causes imprecise transcription of the circuit pattern on the reticle to the wafer in exposure by scanning a reticle stage 104, and the problem of high fraction defective of a chip. The material of the reticle chuck cannot always have the coefficient of thermal expansion for using electrostatic suction type as the reticle chuck, and it makes the problem about thermal expansion big.

BRIEF SUMMARY OF THE INVENTION

Accordingly, it is an exemplary object to provide an exposure apparatus with excellent throughput and optical performance, which provides precise measurement of the reticle and the wafer despite of the temperature change, lowers fraction defective of chips by precise exposure of the circuit pattern, fabricates devices of high performance.

An exposure apparatus of one aspect according to the present invention includes a surrounding member for surrounding an optical system for guiding light from a light source to an object, a holding member for holding the object, and a measuring device for measuring position of the holding member by using a reference surface provided in the holding member, wherein the reference surface is located in an area corresponding to the object which is held by the holding member.

The reference surface may be located substantially at a position corresponding to the center of the object which is held by the holding member. The position substantially corresponding to the center of the object may be fixed to a position substantially corresponding to the center of the holding member. The object may be a reticle or a wafer. The holding member may hold the object by electrostatic suction. The exposure apparatus may expose the object by scanning the object. The light source may be an EUV light source.

A method of another aspect according to the present invention for exposure includes the steps of measuring position of an object founding on a reference surface being provided in a holding member which holds the object, the reference surface being located in an area corresponding to the object, adjusting the position of the object in accordance with the measurement results, and exposing the object by guiding light from a light source to the object.

A device fabricating method of still another aspect according to the present invention includes the steps of exposing an object by the exposure which is explained before, and developing the object that has been exposed.

Other objects and further features of the present invention will become readily apparent from the following description of the preferred embodiments with reference to accompanying drawings.

BRIEF DESCRIPTION OF THE DRAWINGS

FIG. 2 is a schematic enlarged structure in the vicinity of a reticle as a principle part of the exposure apparatus shown in FIG. 1, wherein

FIG. 5 is a schematic enlarged structure in the vicinity of a reticle as a principle part of an exposure apparatus of the second embodiment according to the present invention, wherein FIG. 5A is a front view from front surface of the reticle and FIG. 5B is a side view from side surface of the reticle according to sub-scanning direction.

FIG. 7 shows an example of position measurement of a reticle in a conventional exposure apparatus, wherein

DETAILED DESCRIPTION OF THE PREFERRED EMBODIMENTS

[The First Embodiment]

Figure 1:
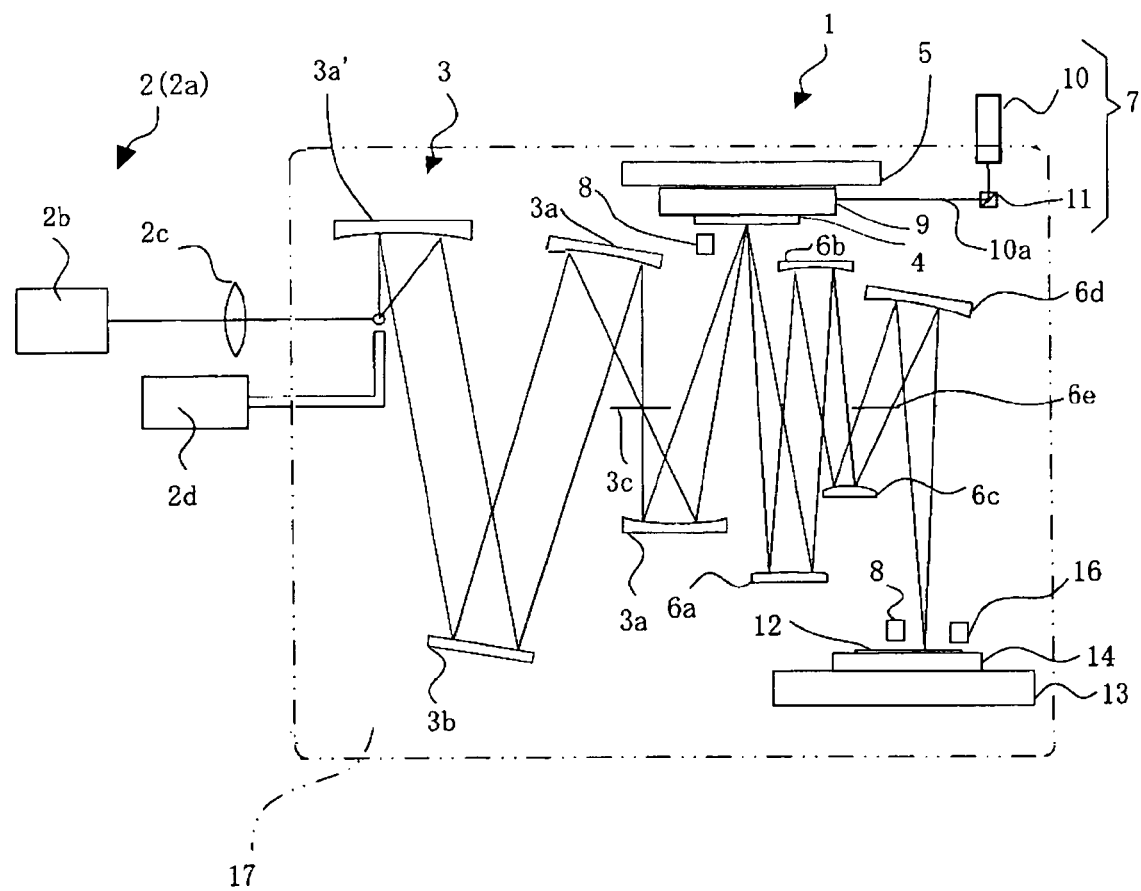
FIG. 1 is a schematic structure of whole exposure portion in an exposure apparatus of the first embodiment according to the present invention.

Referring now to the accompanying drawings, a description will be now given of an exposure apparatus of the first embodiment according to the present invention. FIG. 1 is a schematic structure of whole exposure portion in an exposure apparatus 1 of the first embodiment according to the present invention. The exposure apparatus 1 is a scanning type reduction projection exposure apparatus using EUV light as an exposure light, and includes an EUV light source 2, an illumination system 3, a reflection reticle (hereinafter simply called "reticle") 4, a reticle stage 5, a projection optical system 6, a position measuring device 7, an alignment optical system 8, and a vacuum system 17.

The EUV light source uses, for example, laser plasma light source 2a. The laser plasma light source 2a has a pulse laser 2b for excitation, a condensing lens 2c, a target feed unit 2d. The laser plasma light source 2a irradiates a highly intensified pulse laser beam from the pulse laser 2b to the target material, which is supplied by a target feed unit 2d, put in the vacuum chamber, thus generating a high-temperature plasma. And an EUV light with a wavelength of about 13.4 nm emitted from this is utilized.

The target material, for which a metallic thin film, an inert gas, a droplet, etc. are used, is supplied into the vacuum chamber by the target feed unit 2d such as a gas jet. In order to raise an average intensity of the emitted EUV light, a repeated frequency of the pulse laser 2b should be preferably high, and is operated by the repeated frequency of an ordinary number kHz.

The illumination system 3 for guiding the EUV light from the EUV light source 2 to the reticle 4 as an original form of exposure, includes a plurality of mirrors 3a, an optical integrator 3b. The mirrors 3a use multilayer mirrors or oblique incidence mirrors.

A first condensing mirror 3a' condenses the EUV light emitted isotropically from the EUV light source 2, and forms the EUV light parallel. The optical integrator 3b illuminates the reticle 4 uniformly using specified numerical aperture. Further, an aperture 3c is arranged in a position in the illumination system 3 being substantially conjugate with the reticle 4, and limits the area illuminated on the reticle 4 by the EUV light plane to a circular arc shape or an oblong shape.

Figure 2A:
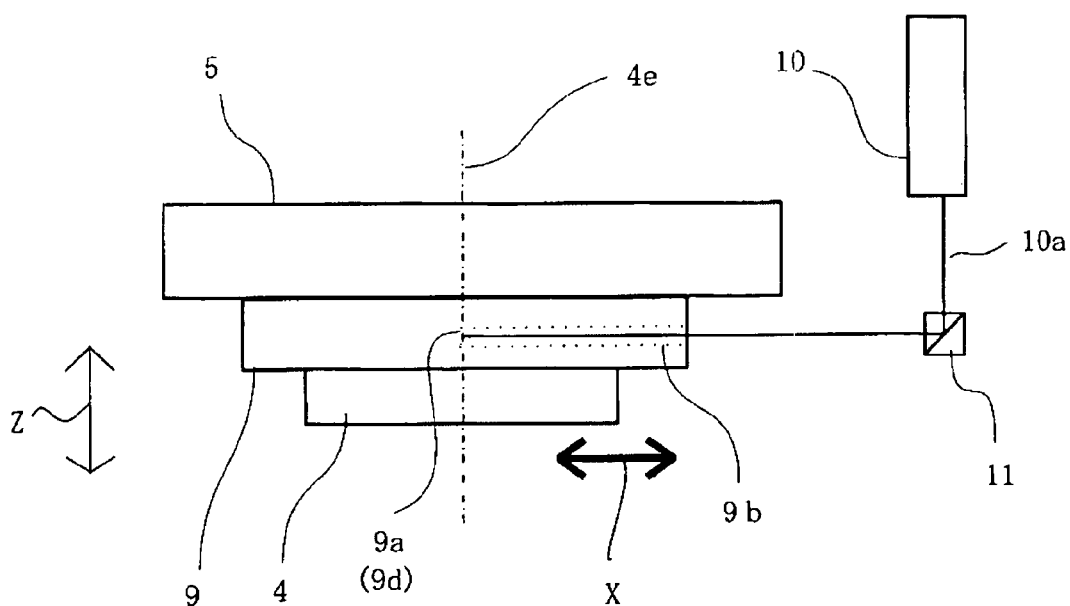
FIG. 2A is a side view from side surface of the reticle and FIG. 2B is a front view from front surface of the reticle.
Figure 2B:
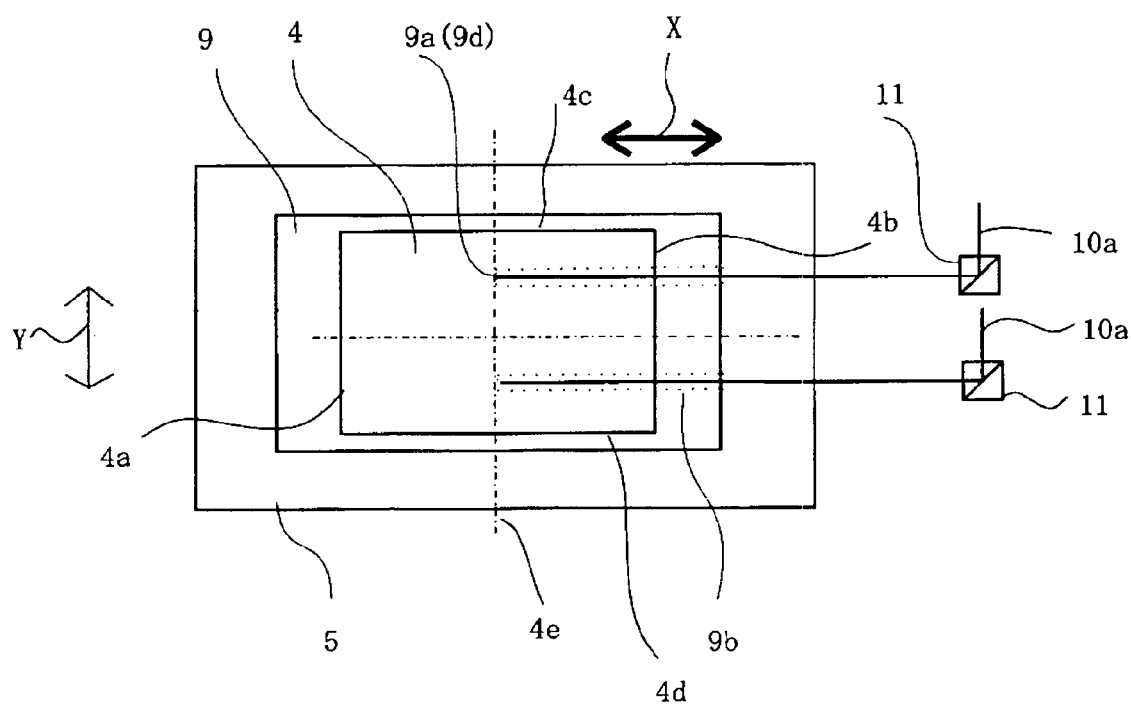

The reticle 4 is an original form on which the circuit pattern to be projected on the wafer is formed. FIG. 2 is a schematic enlarged structure in the vicinity of the reticle 4 as a principle part of the exposure apparatus 1, wherein FIG. 2A is a side view from side surface of the reticle 4 and FIG. 2B is a front view from front surface of the reticle 4.

The reticle 4 forms a pattern to be transferred on the wafer using an absorber like tungsten on a multilayer mirror, and information of the circuit pattern according to the reflected EUV light intensity between on the light-reflecting portion and on the light-absorbing portion. The reticle chuck 9 as a holding member holds the reticle 4. A position substantially corresponding to the center in X-direction (sub-scanning direction) of the reticle 4 is fixed to a position substantially corresponding to the center in X-direction (sub-scanning direction) of the reticle chuck 9. Therefore, the center of the reticle 4 and the center of the reticle chuck 9 are approximately the same positions in X-direction. The reticle chuck 9 uses an electrostatic type in this embodiment because of the reticle 4 being arranged in vacuum state. The reticle chuck 9 is on the reticle stage 5.

The reticle stage 5 precisely scans the reticle 4 along X-direction (sub-scanning direction) in exposure, and uses a precision stage which has a servo motor and a feeding mechanism or a mechanism for high precision scanning and high precision positioning using linear motor, etc. And the reticle stage 5 has a fine adjustment mechanism (not shown) which can finely move in X, Y, Z-directions and rotate around each axis, and can position the reticle 4 precisely.

The reticle chuck 9 has a reference surface 9a thereon. The reference surface 9a is referred in position measurement of the reticle 4, and is located in an area corresponding to the reticle 4. The area corresponding to the reticle 4 means X position from a side surface 4a to a side surface 4b shown in FIG. 2B, in position measurement in X-direction. The area corresponding to the reticle 4 means Y position from a side surface 4c to a side surface 4d shown in FIG. 2B, in position measurement in Y-direction.

The reference surface 9a is located inside the reticle chuck 9, at a position corresponding to the center of the reticle 4 in X-direction, that is, a position corresponding to a centerline 4e of X-direction. As the reticle 4 has inconsistency in its size, the sizes of the plurality of the reticle 4 in a precise view differ respectively. However, the reticle 4 is fixed to the reticle chuck 9 with their center being coincident referring to their center positions in holding the reticle 4 to the reticle chuck 9. Therefore, the position measurement of the reference surface 9a substantially results the same as the position measurement of the center of the reticle 4.

As the reticle 4 is positioned in the vicinity of the reference surface 9a, the position of the reference surface 9a shifts in accordance with the position shift of the reticle 4 caused by the thermal expansion. Therefore, relation between the position of the reference surface 9a and that of the reticle 4 does not produce error for the same position shifts of the reticle 4 and the reference surface 9a, even in the case of the reticle 4 and the reticle chuck 9 being high temperature, shifting their positions by thermal expansion.

A laser measurement unit 10 as a part of the position measuring device 7 is a light source emitting measurement light for measuring the position of the reticle 4. The laser measurement unit 10 emits laser beam (measurement light) 10a to the reference surface 9a via a hole 9b formed in the reticle chuck 9 as a light path. A cube mirror 9d provided on the reference surface 9a reflects the laser beam 10a.

The reflected laser beam 10a is guided to an interferometer 11 as a detector via the hole 9b. The interferometer 11, which is a part of the position measuring device 7, measures the position of the reticle 4 according to the reflected light from the reference surface 9a, and can measure the position of the reference surface 9a precisely according to interaction of the reference light from the laser measurement unit 10 and the reflected light on the reference surface 9a. According to the results of position measuring, the fine adjustment mechanism moves the reticle stage 5 and the reticle chuck 9, and adjusts the position of the reticle 4 precisely.

The reticle stage 5 linearly scans the reticle chuck 9 in X-direction. As the hole 9b is formed parallel to X-direction in this embodiment, the measurement light of the laser measurement unit 10 can reach on the reference surface 9a in scanning of the reticle chuck 9. The light reflected by the reference surface 9a can reach on the interferometer 11, too.

The projection optical system 6 guides EUV light reflected by the reticle 4 onto wafer 12, having a plurality of mirrors 6a–6d and an aperture 6e. The smaller the number of the mirrors used in the projection optical system 6 is, the higher the efficiency of utilization of EUV light is, the more difficult the aberration control is. The aberration control needs from four mirrors to six mirrors, and the reflection surface shape of the mirrors 6a–6d are spherical or aspherical of convex or concave.

The mirrors 6a–6d have reflection surfaces on which the multilayer consisted of Mo/Si etc. is deposited, wherein the reflection surfaces are shaped by grinding and polishing from the surface of the substrate which is made of high rigidity, high degree of hardness, low coefficient of thermal expansion material as low expansion coefficient glass or silicon carbide like the same. Bragg's Equation described before clearly says in multilayer mirror with constant coating cycle, the difference of the light incident angle according to the incident position on the mirror causes the difference of the wavelength of high reflectance of EUV light according to the position on the mirror. So, the mirror is composed to have a distribution in coating cycle so as to acquire the high reflectance in constant wavelength of EUV light on the whole mirror.

The wafer chuck 14 as a holding member which is provided on the wafer stage 13 holds the wafer 12. The wafer stage 13 has a mechanism for high-velocity feeding in X-direction, same as the reticle stage 5. Both of the wafer stage 13 and the reticle stage 5 have scanning mechanisms for scanning in a velocity ratio proportioning to the reduction ratio in exposure projection. The wafer stage 13 has a fine adjustment mechanism (not shown) which can finely move in X, Y, Z-directions and rotate around each axis, and can position the wafer 12 precisely.

The position measuring device (not shown) which has the laser measurement unit and the interferometer, measures the position and the alignment of the wafer stage 13 same as the reticle stage 5. And the fine adjustment mechanism moves the wafer stage 13 and the wafer chuck 14 in accordance with the results of the position measurement for positioning the wafer 12 in a high precision.

An alignment detector including the alignment optical system 8 detects a relative position of the reticle 4 and the optical axis of the projection optical system 6, and a relative position of the wafer 12 and the optical axis of the projection optical system 6. According to the results of the detection, the position and alignment of the reticle stage 5 and the wafer stage 13 are decided so as a projection image of the reticle 4 to be projected on specified position of the wafer 12.

A focus position detector 16 detects a focus position of the surface of the wafer 12 in Z-direction, and always keeps the surface of the wafer 12 in image formation position of the projection optical system 6 in exposure by controlling the position and the alignment of the wafer stage 13.

The exposure apparatus 1 uses an EUV light source 2 for exposure light source. The EUV light, explained before, decreases its intensity by absorption by the air. Therefore, an EUV light path in this exposure apparatus 1 including the illumination optical system 3, the reticle 4, the projection optical system 6, and the wafer 12 is arranged in the vacuum system 17.

A description will now be given of the operation of the exposure apparatus 1.

The exposure apparatus 1 begins to expose with holding the reticle 4 by the reticle chuck 9 and the wafer 12 by the wafer chuck 14. By guiding the EUV light from the EUV light source 2 via the illumination optical system 3 onto the surface of the reticle 4, thereafter, via the projection optical system 6 onto the surface of the wafer 12, the circuit pattern on the reticle 4 is transferred and exposed on the wafer 12.

The exposure apparatus 1 exposes the circuit pattern with scanning. That is, the exposure apparatus 1 irradiates the EUV light being slit by the aperture 3c onto the reticle 4, and exposes by scanning the reticle stage 5 synchronizing to the wafer stage 13 in X-direction with the velocity ratio proportional to the reduction ration of the projection optical system 6. In exposure, the alignment detector adjusts the alignment of the reticle 4 and the wafer 12, the focus position detector 16 adjusts the focus position of the wafer 12, and the circuit pattern on the reticle 4 is accurately transferred on the specified position on the wafer 12.

The wafer stage 12 steps in X-Y-directions to beginning position of the next scanning when finishing one process of the scanning exposure in sub-scanning direction on the wafer 12. Then, the wafer stage 12 begins to scan in X-direction again synchronizing to the reticle stage 5 with the velocity ratio proportional to the reduction ratio of the projection optical system 6.

Thus, the repetition of the scanning exposure with synchronization of the reticle 4 and the wafer 12 in image formation state of a reduction projection image of the reticle 4 on the wafer 12 gradually forms an image of the circuit pattern of the reticle 4 onto the wafer 12. The series of the operation is called "step-and-scan", and the circuit pattern is transferred onto the whole surface of the wafer 12 by step-and-scan.

The temperature of the reticle 4 becomes high for being illuminated by EUV light in this scanning exposure. The leakage current also heats the reticle chuck 9 as electrostatic suction type in this embodiment. More, the reticle 4 and the reticle chuck 9 are arranged in vacuum state by the vacuum system 17, consequently, the heat radiation to atmosphere is little, the heat is stored, and the temperature of them become higher.

By high temperature, the thermal expansion occurs on the reticle 4 and the reticle chuck 9. However, the position shift of the reticle 4 in X-direction by thermal expansion is approximately the same as that of the reference surface 9a, because the reference surface 9a is located on the centerline 4e of the reticle 4 in X-direction. Therefore, the relative position of the reticle 4 and the reference surface 9a in X-direction keep the same in spite of temperature change of the reticle 4 and the reticle chuck 9. The position of the reticle 4 can be detected precisely by measuring the position of the reference surface 9a, and the detection result does not err.

Figure 3:
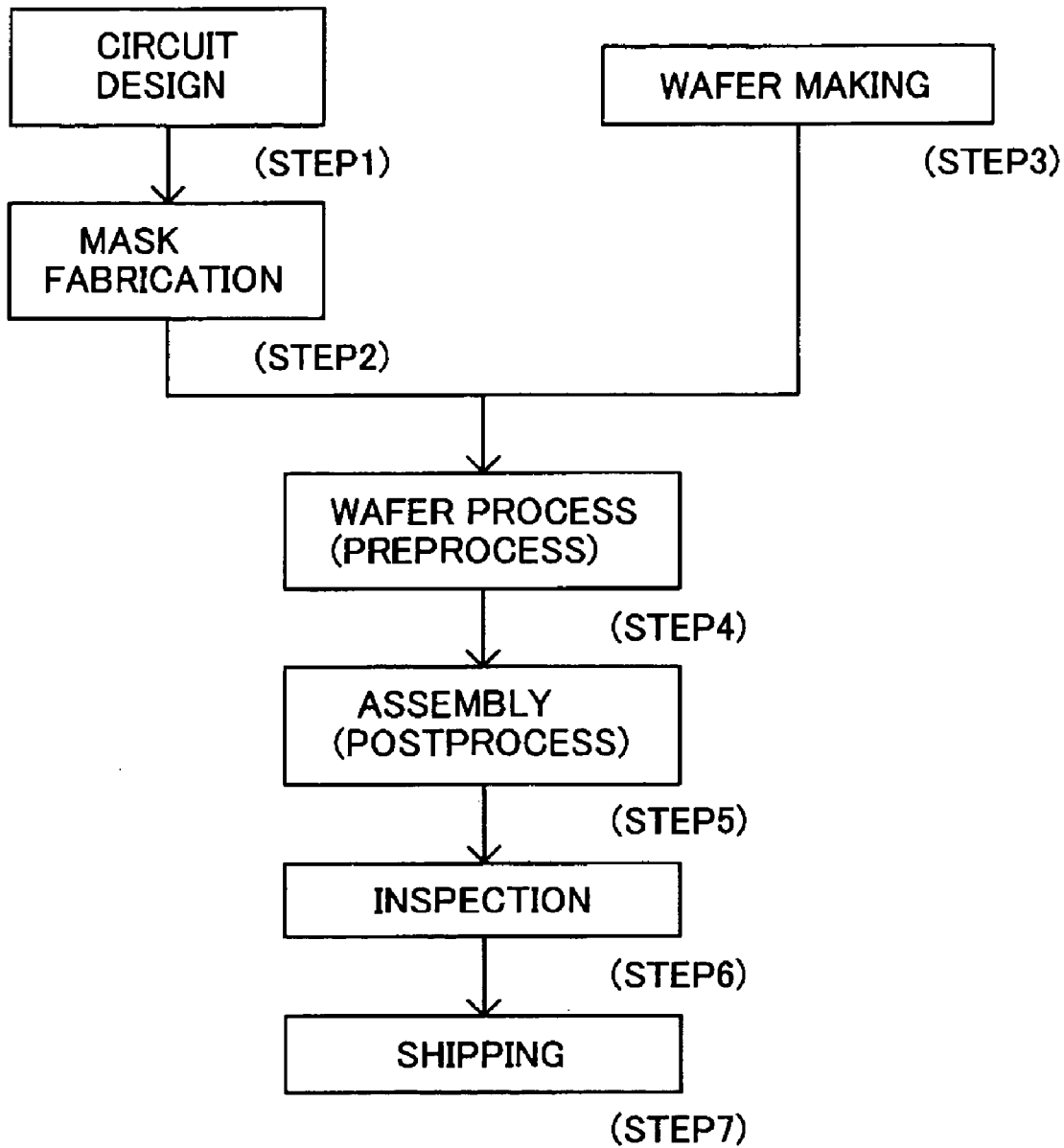
FIG. 3 is a flowchart for explaining a method for fabricating devices including an exposure process by the exposure apparatus shown in FIG. 1.
Figure 4:
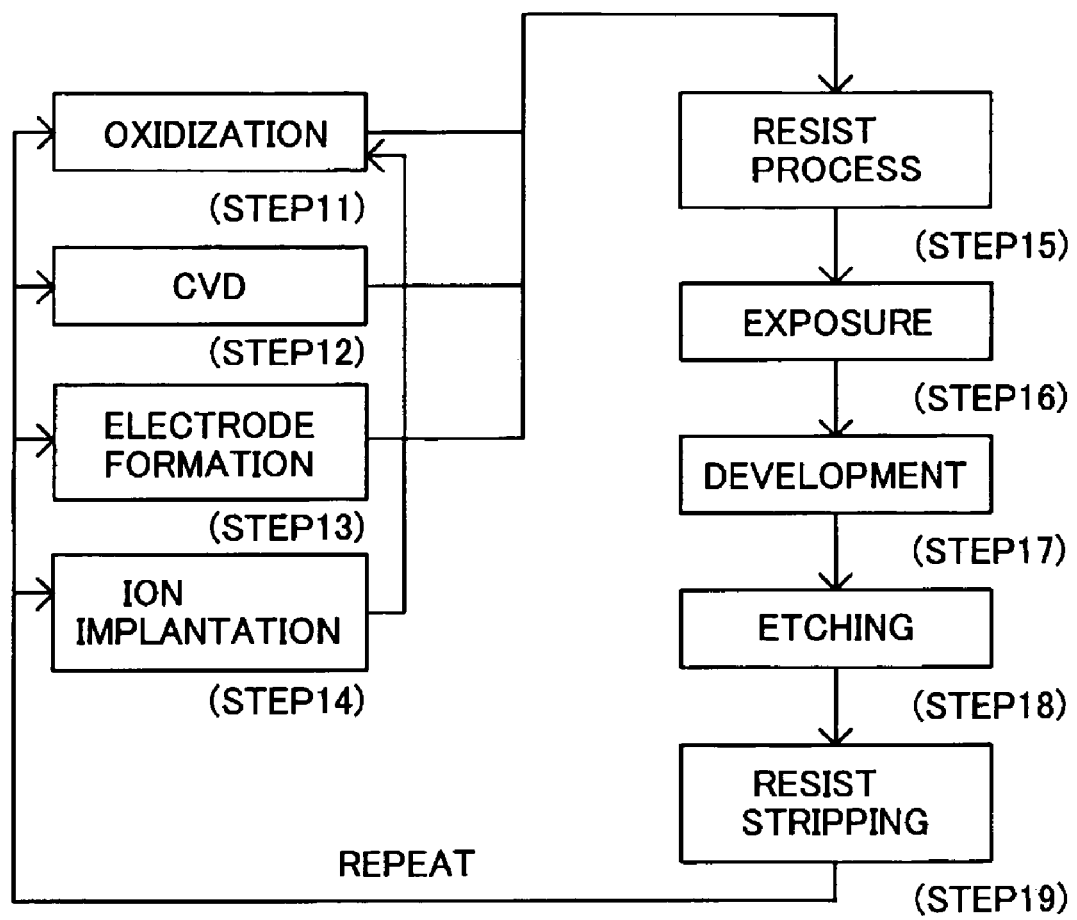
FIG. 4 is a detailed flowchart for Step 4 of wafer process shown in FIG. 3.

Referring now to FIGS. 3 and 4, a description will be given of an embodiment of a device fabricating method using the above exposure apparatus 1. FIG. 3 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 4 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Still more according to this embodiment, the longer the distance between the reference surface 9a and the center line 4e of the reticle 4 in X-direction is, the larger the error related in the relative position of the reticle 4 and the reference surface 9a of the reticle chuck 9 caused by the thermal expansion is. It is not necessary to be limited of the structure in this embodiment which the reference surface 9a is on the center line 4e of the reticle 4 in X-direction. It is substantially no problem of the structure which the reference surface 9a is located in an area corresponding to the reticle 4, or in the X position from the side surface 4a to the side surface 4b.

Generally, the reticle 4 has a size in X-direction longer than a size in Y-direction. So, the problem is relatively small in the position shift of the reticle 4 by the thermal expansion in Y-direction (main-scanning direction) comparing to that in X-direction (sub-scanning direction).

However, in detecting the position shift of the reticle 4 in Y-direction (main-scanning direction), a reference surface for measuring Y position of the reticle 4 should be located on the reticle chuck 9 in an area corresponding to the reticle 4, or in the Y position from the side surface 4c to the side surface 4d, for example, preferably approximately on the center line of the reticle 4 in Y-direction.

The present invention is applicable to the position measurement of the wafer 12 despite the description has been given as an example in case of the position measurement of the reticle 12 in this embodiment. That is, by locating a reference surface in an area corresponding to the wafer 12, or preferably approximately in the center of the wafer 12, and by measuring the position of the wafer 12 in accordance with the reference surface, the position of the wafer 12 can be measured precisely in spite of the thermal expansion of the wafer 12 and the wafer chuck 14. The explanation about its structure is omitted for the sameness in the reticle 4 and the reticle chuck 9.

The exposure apparatus 1 does not use only EUV light as the exposure light, but the light applicable to exposure like a visible light, an ultra violet light, X ray, or electron beam. More, the exposure apparatus 1 is not limited to step-and-scan type described in this embodiment, but applicable to step-and-repeat type.

[The Second Embodiment]

Figure 5:
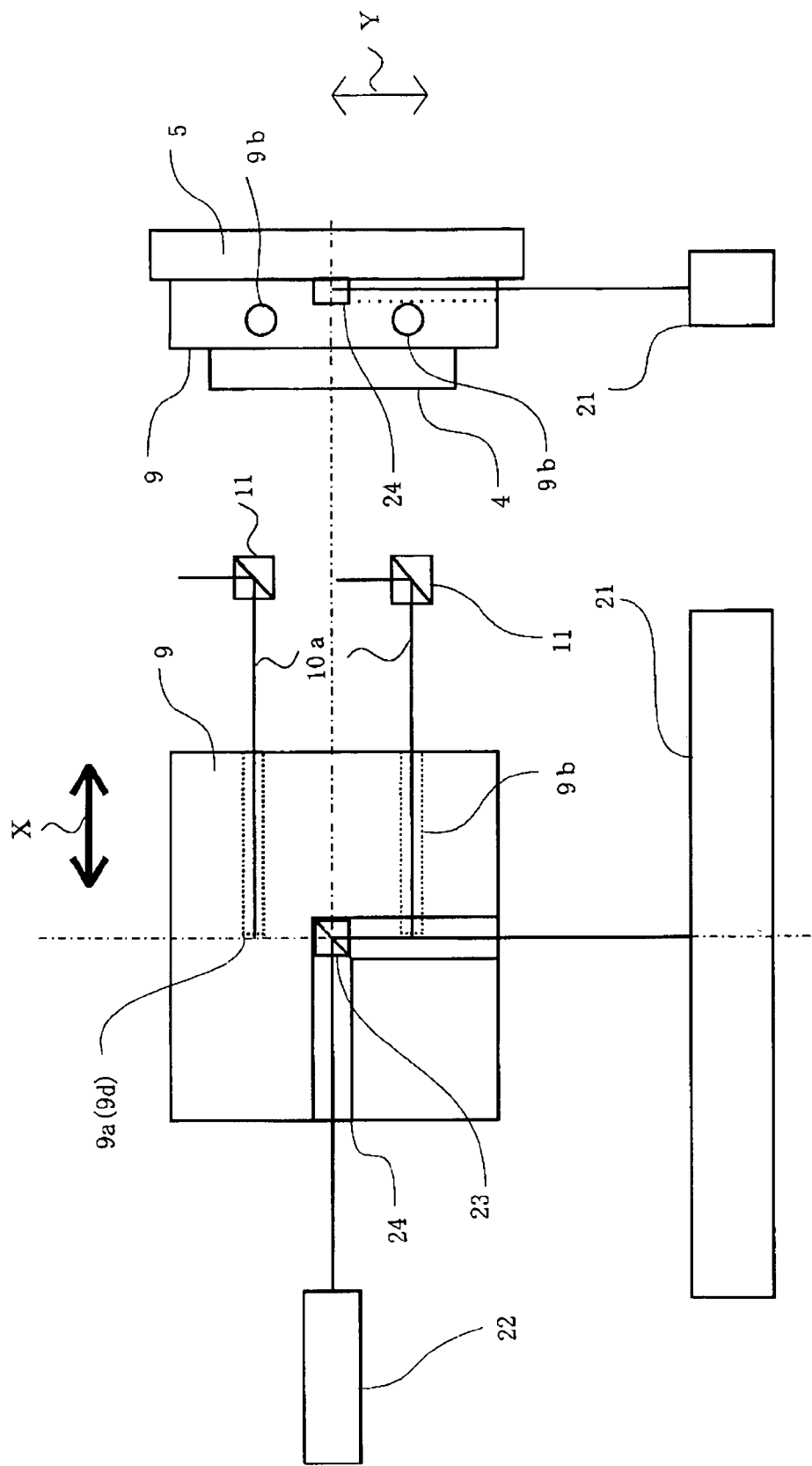

A description will be now given of an structure which measures the position of the reticle 4 in Y-direction (main-scanning direction) in addition to X-direction (sub-scanning direction). FIG. 5 is a schematic enlarged structure in the vicinity of the reticle 4 in an exposure apparatus of the second embodiment according to the present invention, wherein FIG. 5A is a front view from front surface of the reticle 4 and FIG. 5B is a side view from side surface of the reticle 4 according to sub-scanning direction (X-direction).

A bar mirror 21 is fixed to main body of the exposure apparatus in this embodiment. Numerical references 22, 23 are a laser measurement unit and an interferometer respectively, and they compose a position measuring device for measuring the position of the reticle 4 in Y-direction. An "L" shaped gutter (a light path) 24 is formed in the reticle chuck 9 for laser beam. The reticle chuck 9 has the gutter 24 on opposite side of contacting surface to the reticle 4 as a bottom surface 9c. The interferometer 23 is located at the position corresponding to a corner of the "L" shape inside the reticle chuck 9, which approximately corresponds to the center of the reticle 4 in Y-direction shown in FIG. 5A, and functions as a reference surface for measuring the position of the reticle 4 in Y-direction.

The bar mirror 21 as a measuring plane for measuring the position of the reticle 4 needs length corresponding to scanning length in scanning exposure. And, it is inconvenient to provide the long bar mirror 21 on the reticle stage 5. Therefore, the bar mirror 21 is fixed to the main body of the exposure apparatus and the interferometer 23 functioning as the reference surface is located approximately on the center position in the reticle chuck 9 in Y-direction for measuring the position of the reticle 4 in Y-direction perpendicular to X-direction.

Therefore, the position measurement of the reticle 4 hardly errs and the position of the reticle 4 can be detected precisely with this structure despite the reticle 4 and the reticle chuck 9 expand by their high temperature.

Still more, the L shaped gutter 24 formed on the bottom surface 9c of the reticle chuck 9 is not limited as described in this embodiment. The gutter 24 may be a different light path from the hole 9b without interference respectively, and may be formed on the contact surface to the reticle 4.

[The Third Embodiment]

The position measurement using two reference surfaces 9a described in the first embodiment makes it possible to measure the rotation shift of the reticle 4 in XY plane according to differential data of the measurement results. Basically, the X positions of two reference surfaces 9a should be the same, and the difference of two positions means rotation of the reticle stage 9 in XY plane. So, the rotation shift of the reticle 4 in XY plane can be measured according to the differential data of the measurement results of two positions.

Figure 6:
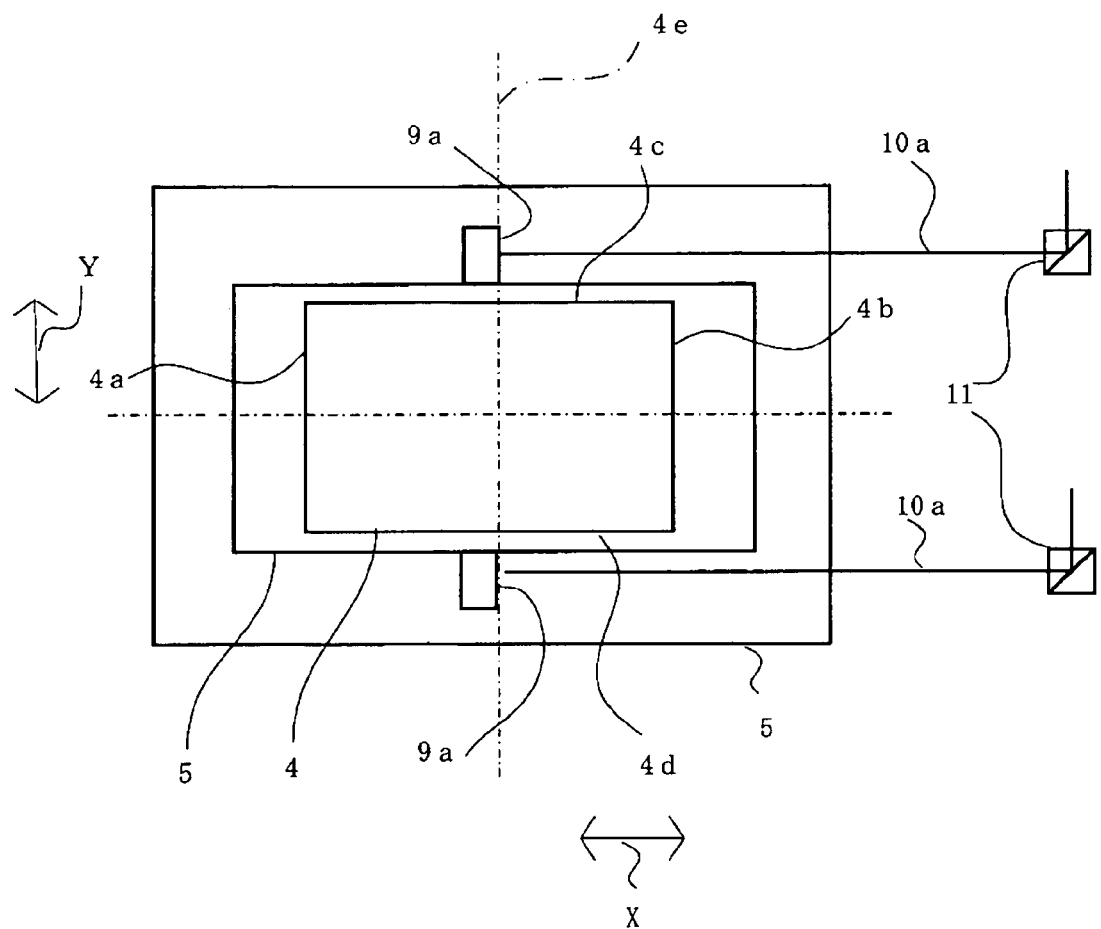
FIG. 6 is a schematic enlarged structure in the vicinity of a reticle as a principle part of an exposure apparatus of the third embodiment according to the present invention.
Figure 7A:
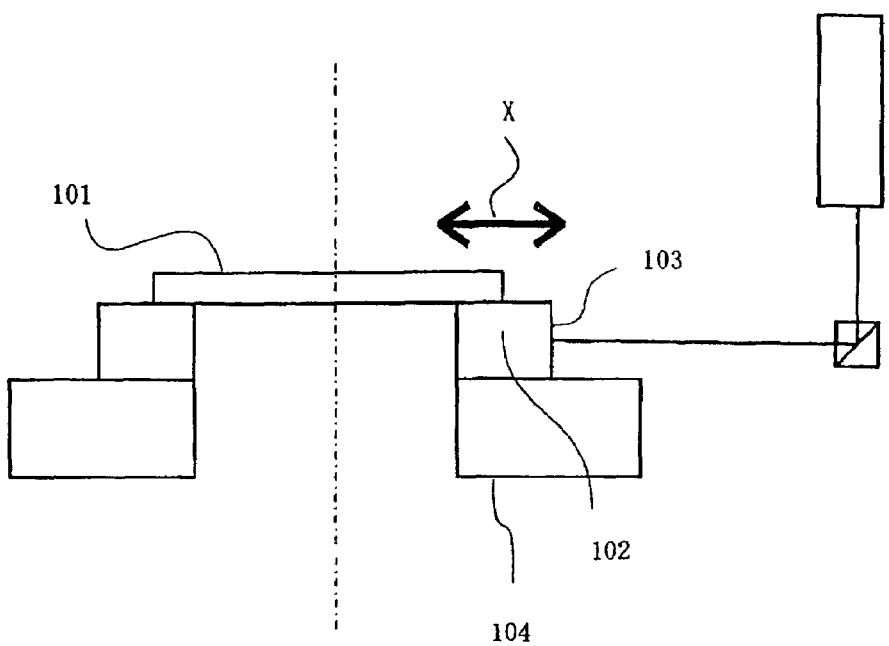
FIG. 7A is a front view in the vicinity of the reticle from front surface of the reticle as a principle part and FIG. 7B is a side view in the vicinity of the reticle from side surface of the reticle as a principle part.
Figure 7B:
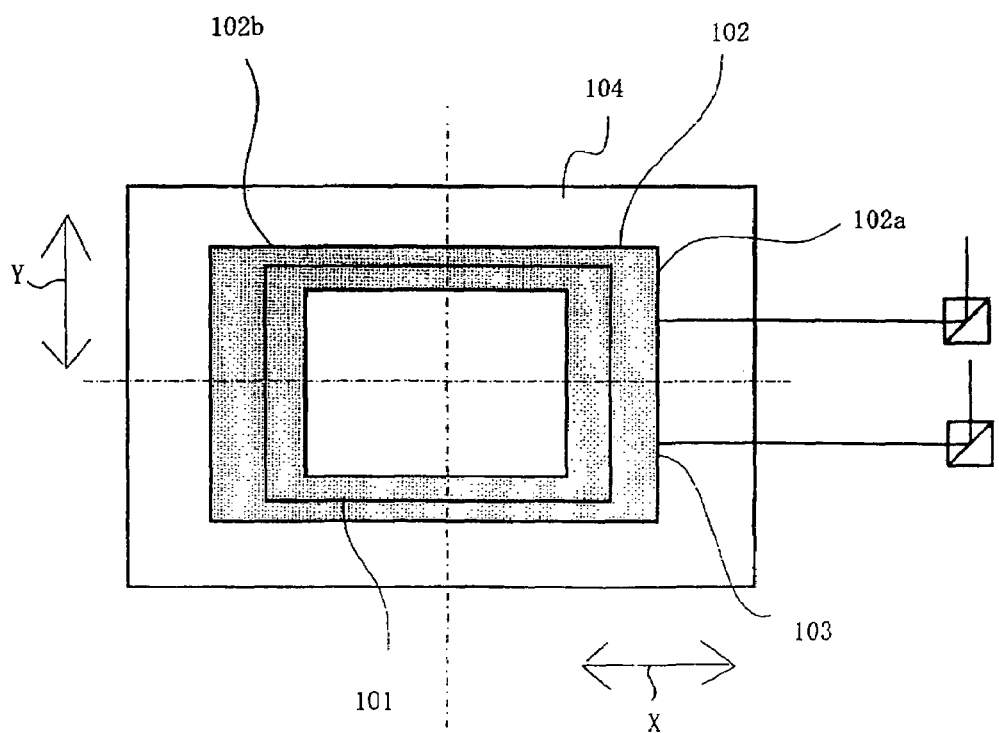

The measurement of the rotation shift can be achieved with the structure shown in the first embodiment, but can further improve its accuracy by locating the reference surfaces 9a on the side surface 4c, 4d of the reticle chuck 9 as shown in FIG. 6. FIG. 6 is a schematic enlarged structure in the vicinity of the reticle 4 of the exposure apparatus of the third embodiment according to the present invention.

The reference surfaces 9a are located on the side surface 4c, 4d of the reticle chuck 9 and on the centerline 4e of the reticle 4 in X-direction. For the reference surfaces 9a being located on the center line 4e in X-direction, the relative position of the reticle 4 and the reference surfaces 9a in x-direction keep the same in spite the reticle 4 and the reticle chuck 9 of becoming high temperature. Therefore, the position of the reticle 4 can be detected precisely by measuring the position of the reference surfaces 9a, and the detection result does not err.

The two reference surfaces 9a are respectively located on the side surface 4c and on the side surface 4d which are most distant in the reticle chuck 9 in Y-direction. The reference surfaces 9a differ a lot in their X positions if the reticle chuck 9 rotates in XY plane. So, the rotation shift of the reticle 4 in XY plane can be measured precisely by measuring the positions of both reference surfaces 9a.

The structure in the third embodiment does not need for measuring the position of the reticle 4 to provide the hole 9b or the gutter 24 in the reticle chuck 9, and is not applicable only to the reflection reticle 4 but also to the transmission reticle.

Further, the present invention is not limited to these preferred embodiments, and various variations and modifications may be made without departing from the scope of the present invention.

What is claimed is:

1. An exposure apparatus comprising:

an optical system for guiding light from a light source to a reflection reticle;

a reticle chuck for holding the reflection reticle by electrostatic suction; and a reference surface providing in the reticle chuck, wherein the reference surface is located in an area corresponding to a reticle pattern of the reflection reticle which is held by the reticle chuck, wherein the reference surface is located substantially at a position corresponding to the center of the reflection reticle which is held by the holding reticle chuck.

2. An exposure apparatus according to claim 1, wherein the position substantially corresponding to the center of the reflection reticle is fixed to a position substantially corresponding to the center of the reticle chuck.

3. An exposure apparatus according to claim 1, exposes an object by scanning the reflection reticle.

4. An exposure apparatus according to claim 1, wherein the light source is an EUV light source.

5. A device fabrication method comprising the steps of:

exposing an object by an expossure apparatus according to claim 1; and developing the object that has been exposed.

6. An exposure method comprising the steps of:

measuring position of a reflection reticle founding on a reference surface being provided in a reticle chuck which holds the relection reticle by electrostatic suction, the reference surface being located substantially at a position corresponding to the center of the reflection reticle which is held by the holding reticle chuck, adjusting the position of the object in accordance with the measurement results; and exposing the object by guiding light from a light source to the object.

* * * * *